(12) United States Patent
Campiglio et al.

(10) Patent No.: US 12,248,039 B2
(45) Date of Patent: Mar. 11, 2025

(54) INTERLEAVING SUB-ARRAYS OF MAGNETORESISTANCE ELEMENTS BASED ON REFERENCE DIRECTIONS TO COMPENSATE FOR BRIDGE OFFSET

(71) Applicant: Allegro MicroSystems, LLC, Manchester, NH (US)

(72) Inventors: Paolo Campiglio, Arcueil (FR); Noémie Belin, Villejuif (FR); Pierrick Charlier, Palaiseau (FR)

(73) Assignee: Allegro MicroSystems, LLC, Manchester, NH (US)

(*) Notice: Subject to any disclaimer, the term of this patent is extended or adjusted under 35 U.S.C. 154(b) by 108 days.

(21) Appl. No.: 18/366,737

(22) Filed: Aug. 8, 2023

(65) Prior Publication Data

US 2025/0052838 A1  Feb. 13, 2025

(51) Int. Cl.
*G01R 33/09* (2006.01)

(52) U.S. Cl.
CPC .................. *G01R 33/098* (2013.01)

(58) Field of Classification Search
CPC .. G01R 33/098; G01R 33/00; G01R 33/0005; G01R 33/0047; G01R 33/0094
See application file for complete search history.

(56) References Cited

U.S. PATENT DOCUMENTS

| | | |
|---|---|---|
| 3,858,189 A | 12/1974 | Beausoleil et al. |
| 3,860,965 A | 1/1975 | Voegeli |
| 4,035,785 A | 7/1977 | Kryder |
| 4,078,230 A | 3/1978 | George |
| 4,159,537 A | 6/1979 | Schwartz |
| 4,343,026 A | 8/1982 | Griffith et al. |
| 4,432,069 A | 2/1984 | Rose et al. |
| 4,525,668 A | 6/1985 | Lienhard et al. |
| 4,596,950 A | 6/1986 | Lienhard et al. |
| 4,691,259 A | 9/1987 | Imakoshi |
| 4,712,064 A | 12/1987 | Eckardt et al. |
| 4,823,075 A | 4/1989 | Alley |
| 4,847,584 A | 7/1989 | Pant |
| 4,860,432 A | 8/1989 | Kawata |

(Continued)

FOREIGN PATENT DOCUMENTS

| | | |
|---|---|---|
| DE | 42 12 737 C1 | 7/1993 |
| DE | 196 50 078 A1 | 6/1998 |

(Continued)

OTHER PUBLICATIONS

U.S. Appl. No. 17/806,336, filed Jun. 10, 2022, Lassalle-Balier, et al.

(Continued)

*Primary Examiner* — Alvaro E Fortich
(74) *Attorney, Agent, or Firm* — DALY, CROWLEY, MOFFORD & DURKEE, LLP

(57) ABSTRACT

In one aspect, a bridge includes at least eight sets of sub-arrays. Each one of the at least eight sets of sub-arrays forms a corresponding one magnetoresistance element. Each one of the at least eight sets of sub-arrays has a reference direction. The at least eight sets of sub-arrays are arranged in a matrix on a die. A reference direction of each one of the at least eight sets of sub-arrays is different from a reference direction of at least one other of the at least eight sets of sub-arrays.

27 Claims, 11 Drawing Sheets

(56) References Cited

U.S. PATENT DOCUMENTS

| | | |
|---|---|---|
| 4,937,521 A | 6/1990 | Yoshino et al. |
| 4,939,449 A | 7/1990 | Cattaneo et al. |
| 4,939,459 A | 7/1990 | Akachi et al. |
| 5,041,780 A | 8/1991 | Rippel |
| 5,049,809 A | 9/1991 | Wakatsuki et al. |
| 5,227,721 A | 7/1993 | Kataoka et al. |
| 5,260,653 A | 11/1993 | Smith et al. |
| 5,500,590 A | 3/1996 | Pant |
| 5,561,368 A | 10/1996 | Dovek et al. |
| 5,570,034 A | 10/1996 | Needham et al. |
| 5,583,725 A | 12/1996 | Coffey et al. |
| 5,617,071 A | 4/1997 | Daughton |
| 5,621,377 A | 4/1997 | Dettmann et al. |
| 5,686,838 A | 11/1997 | van den Berg |
| 5,719,494 A | 2/1998 | Dettmann et al. |
| 5,831,426 A | 11/1998 | Black, Jr. et al. |
| 5,877,705 A | 3/1999 | Sampey |
| 5,945,825 A | 8/1999 | Clemens |
| 5,952,825 A | 9/1999 | Wan |
| 6,002,553 A | 12/1999 | Stearns et al. |
| 6,021,065 A | 2/2000 | Daughton et al. |
| 6,031,273 A | 2/2000 | Torok et al. |
| 6,100,686 A | 8/2000 | Van Delden et al. |
| 6,175,296 B1 | 1/2001 | Tokunaga et al. |
| 6,300,617 B1 | 10/2001 | Daughton et al. |
| 6,315,875 B1 | 11/2001 | Sasaki |
| 6,316,931 B1 | 11/2001 | Nakagawa et al. |
| 6,323,634 B1 | 11/2001 | Nakagawa et al. |
| 6,329,818 B1 | 12/2001 | Tokunaga et al. |
| 6,331,773 B1 | 12/2001 | Engel |
| 6,392,852 B1 | 5/2002 | Sasaki |
| 6,404,191 B2 | 6/2002 | Daughton et al. |
| 6,411,078 B1 | 6/2002 | Nakagawa et al. |
| 6,429,640 B1 | 8/2002 | Daughton et al. |
| 6,437,558 B2 | 8/2002 | Li et al. |
| 6,445,171 B2 | 9/2002 | Sandquist et al. |
| 6,459,255 B1 | 10/2002 | Tamai et al. |
| 6,462,541 B1 | 10/2002 | Wang et al. |
| 6,501,678 B1 | 12/2002 | Lenssen et al. |
| 6,566,856 B2 | 5/2003 | Sandquist et al. |
| 6,591,481 B2 | 7/2003 | Shimazawa et al. |
| 6,642,705 B2 | 11/2003 | Kawase |
| 6,657,826 B2 | 12/2003 | Shimazawa et al. |
| 6,664,785 B2 | 12/2003 | Kohlstedt |
| 6,667,682 B2 | 12/2003 | Wan et al. |
| 6,693,826 B1 | 2/2004 | Black et al. |
| 6,721,140 B2 | 4/2004 | Inoue et al. |
| 6,759,841 B2 | 7/2004 | Goto et al. |
| 6,781,359 B2 | 8/2004 | Stauth et al. |
| 6,788,568 B2 | 9/2004 | Hidaka |
| 6,967,798 B2 | 11/2005 | Homola et al. |
| 6,970,333 B2 | 11/2005 | Boeve |
| 7,071,074 B2 | 7/2006 | Schmidt et al. |
| 7,248,045 B2 | 7/2007 | Shoji |
| 7,259,545 B2 | 8/2007 | Stauth et al. |
| 7,336,064 B2 | 2/2008 | Ludwig et al. |
| 7,495,624 B2 | 2/2009 | Daalmans |
| 7,777,607 B2 | 8/2010 | Taylor et al. |
| 7,795,862 B2 | 9/2010 | Doogue et al. |
| 10,114,085 B2 | 10/2018 | Eagen et al. |
| 10,330,745 B2 | 6/2019 | Eagen et al. |
| 10,605,874 B2 | 3/2020 | Lassalle-Balier et al. |
| 10,753,989 B2 | 8/2020 | Campiglio et al. |
| 11,175,359 B2 | 11/2021 | Lassalle-Balier et al. |
| 11,187,764 B2 | 11/2021 | Lassalle-Balier et al. |
| 11,199,424 B2 | 12/2021 | Lassalle-Balier et al. |
| 11,215,681 B2 | 1/2022 | David et al. |
| 11,346,894 B2 | 5/2022 | Belin |
| 11,630,168 B2 | 4/2023 | Lassalle-Balier et al. |
| 11,719,527 B2 | 8/2023 | Lassalle-Balier |
| 11,782,103 B2 | 10/2023 | Lassalle-Balier et al. |
| 2002/0024337 A1 | 2/2002 | Levert et al. |
| 2002/0180433 A1 | 12/2002 | Van Zon et al. |
| 2002/0186011 A1 | 12/2002 | Murata et al. |
| 2004/0023064 A1 | 2/2004 | Ehresmann et al. |
| 2004/0137275 A1 | 7/2004 | Jander et al. |
| 2005/0007834 A1 | 1/2005 | Hidaka |
| 2006/0071655 A1 | 4/2006 | Shoji |
| 2006/0077598 A1 | 4/2006 | Taylor et al. |
| 2006/0087318 A1 | 4/2006 | Crolly et al. |
| 2006/0091993 A1 | 5/2006 | Shoji |
| 2006/0114098 A1 | 6/2006 | Shoji |
| 2006/0145690 A1 | 7/2006 | Shoji |
| 2006/0170529 A1 | 8/2006 | Shoji |
| 2006/0291106 A1 | 12/2006 | Shoji |
| 2007/0044370 A1 | 3/2007 | Shoji |
| 2007/0076332 A1 | 4/2007 | Matus et al. |
| 2007/0090825 A1 | 4/2007 | Shoji |
| 2007/0096716 A1 | 5/2007 | Shoji |
| 2007/0134921 A1 | 6/2007 | Tian et al. |
| 2007/0188946 A1 | 8/2007 | Shoji |
| 2007/0247144 A1 | 10/2007 | Tokuhara et al. |
| 2007/0247943 A1 | 10/2007 | Sato et al. |
| 2008/0309331 A1 | 12/2008 | Qian et al. |
| 2010/0308923 A1 | 12/2010 | Kaka |
| 2010/0327857 A1 | 12/2010 | Hoshiya et al. |
| 2011/0062537 A1 | 3/2011 | Oh et al. |
| 2011/0163739 A1 | 7/2011 | Ono et al. |
| 2012/0112741 A1 | 5/2012 | Meguro et al. |
| 2015/0194430 A1 | 7/2015 | Karda et al. |
| 2017/0033283 A1 | 2/2017 | Pinarbasi et al. |
| 2017/0302280 A1 | 10/2017 | Vaysset et al. |
| 2019/0178954 A1 | 6/2019 | Lassalle-Balier et al. |
| 2019/0219643 A1* | 7/2019 | Cadugan ............ G01R 33/0094 |
| 2020/0371170 A1* | 11/2020 | Tran ........................ G01P 3/488 |
| 2021/0280348 A1 | 9/2021 | Bortolotti et al. |
| 2021/0293907 A1* | 9/2021 | Lassalle-Balier ........ G02B 7/04 |
| 2021/0293911 A1* | 9/2021 | Lassalle-Balier .... G01R 33/098 |
| 2022/0244324 A1 | 8/2022 | Belin |
| 2023/0332878 A1 | 10/2023 | Lassalle-Balier et al. |

FOREIGN PATENT DOCUMENTS

| | | |
|---|---|---|
| DE | 100 17 374 A1 | 12/2000 |
| DE | 101 59 607 A1 | 9/2002 |
| DE | 101 28 150 C1 | 1/2003 |
| DE | 10 155 423 A1 | 5/2003 |
| DE | 102 02 287 C1 | 8/2003 |
| DE | 102 22 395 A1 | 12/2003 |
| DE | 10 2004 003 369 A1 | 8/2005 |
| DE | 10 2004 009 267 B3 | 9/2005 |
| DE | 10 2004 038 847 B3 | 9/2005 |
| DE | 10 2004 040 079 B3 | 12/2005 |
| DE | 10 2005 037 905 A1 | 3/2006 |
| DE | 10 2004 053 551 A1 | 5/2006 |
| DE | 10 2006 008 257 A1 | 10/2006 |
| DE | 10 2006 021 774 A1 | 1/2007 |
| DE | 10 2005 038 655 B3 | 3/2007 |
| DE | 10 2005 040 539 A1 | 3/2007 |
| DE | 10 2005 052 688 A1 | 5/2007 |
| DE | 10 2006 007 770 A1 | 8/2007 |
| DE | 10 2006 028 698 | 12/2007 |
| EP | 0 539 081 A1 | 4/1993 |
| EP | 0 710 850 A2 | 5/1996 |
| EP | 1 720 027 A1 | 11/2006 |
| JP | 57187671 A | 11/1982 |
| JP | 42 12 737 A | 8/1992 |
| JP | 2000-174358 | 6/2000 |
| JP | 2001-345498 A | 12/2001 |
| JP | 2002-353418 | 12/2002 |
| JP | 2003-179283 | 6/2003 |
| JP | 2003-525528 | 8/2003 |
| JP | 2004-117367 A | 4/2004 |
| JP | 2006-126087 A | 5/2006 |
| WO | WO 2004/109725 A1 | 12/2004 |
| WO | WO 2005/064357 A2 | 7/2005 |
| WO | WO 2006/040719 A1 | 4/2006 |
| WO | WO 2006/136577 A1 | 12/2006 |
| WO | WO 2007/147760 A2 | 12/2007 |

(56) References Cited

OTHER PUBLICATIONS

U.S. Appl. No. 18/354,903, filed Jul. 19, 2023, Lassalle-Balier, et al.
Analog Devices Inc., "High-Speed Digital Isolators, AduM1100AR/AduM1100BR;" Data Sheet; Jan. 2001; 12 Pages.
Daughton et al.; "Magnetic Field Sensors Using GMR Multilayer", IEEE Transactions on Magnetics, vol. 30, No. 6; Nov. 1, 1994; pp. 4608-4610; 3 Pages.
Hirota et al.; "Giant Magneto-Resistance Devices;" Springer Series in Surface Sciences, 40; ISBN-10:3540418199; ISBN-13: 9783540418191; 9 Pages.
NVE Corporation, "Utilization of GMR Materials. Analog Bridge Output Devices;" Retrieved from: www.nve.com/technical/explinations//Bridge.html; 3 Pages.
Prinz; "Magnetoelectronics Applications;" Journal of Magnetism and Magnetic Materials, Elsevier Science Publishers; vol. 200, No. 1-3; Oct. 1, 1999; pp. 57-68; XP004364006; ISSN: 0304-8853; 12 Pages.
Spong et al.; "Giant Magnetoresistive Spin Valve Bridge Sensor;" IEEE Transactions on Magnetics; vol. 32, No. 2; Mar. 1, 1996; pp. 366-371; XP011030196; ISSN: 0018-9464; 6 Pages.
Takenaga et al., "High-Temperature Operations of Rotation Angle Sensors With Spin-Valve-Type Magnetic Tunnel Junctions;" IEEE Transactions on Magnetics; vol. 41, No. 10; Oct. 2005; pp. 3628-3630; 3 Pages.
PCT International Search Report and Written Opinion dated Jan. 18, 2006 for International Appln. No. PCT/US2005/029982; 13 Pages.
PCT International Preliminary Report dated Apr. 17, 2007 for International Application No. PCT/US2005/029982; 7 Pages.
European $1^{st}$ Official Communication dated Apr. 25, 2008 for European Application No. 05794713.7; 7 Pages.
Response to European $1^{st}$ Official Communication dated Apr. 25, 2008 for EP Application No. 05794713.7; Response filed Nov. 5, 2008; 15 Pages.
European $2^{nd}$ Official Communication dated Oct. 2, 2009 for European Application No. 05794713.7; 6 Pages.
Response to European $2^{nd}$ Official Communication dated Oct. 2, 2009 for European Application No. 05794713.7; Response filed Apr. 12, 2010; 11 Pages.
European Notice of Allowance dated Nov. 11, 2011 for European Application No. 05794713.7; 6 Pages.
Letter from Japanese Attorney dated Apr. 12, 2010 and Translation of Japanese Office Action dated Feb. 19, 2010 for Japanese Application No. 2007-536689; 5 Pages.
Response (with Machine English Translation) to $1^{st}$ Japanese Office Action dated Feb. 19, 2010 for Japanese Application No. 2007-536689; Response filed Jun. 21, 2010; 14 Pages.
Japanese $2^{nd}$ Office Action (with Machine English Translation) dated Aug. 13, 2010 for Japanese Application No. 2007-536689; 5 Pages.
Response (with Machine English Translation) to $2^{nd}$ Japanese Office Action dated Aug. 13, 2010 for Japanese Application No. 2007-536689; Response filed Dec. 17, 2010; 4 Pages.
Japanese Decision to Grant (with Machine English Translation) dated Mar. 8, 2011 for Japanese Application No. 2007-536689; 5 Pages.
Japanese $1^{st}$ Office Action (with Machine English Translation) dated Feb. 16, 2012 for Japanese Application No. 2010-281172; 4 Pages.
Response (with Machine English Translation) to Japanese $1^{st}$ Office Action dated Feb. 16, 2012 for Japanese Application No. 2010-281172; Response filed May 18, 2012; 8 Pages.
Japanese $2^{nd}$ Office Action (with Machine English Translation) dated Nov. 6, 2012 for Japanese Application No. 2010-281172; 4 Pages.
Request for Appeal (with Machine English Translation) Filed in Response to Japanese $2^{nd}$ Office Action dated Nov. 6, 2012 for Japanese Application No. 2010-281172; Request for Appeal filed Mar. 8, 2013; 14 Pages.
Trial and Appeal Decision (with Machine English Translation) dated Apr. 4, 2014 for Japanese Application No. 2010-281172; 13 Pages.
Japanese Office Action (with Machine English Translation) dated Feb. 27, 2014 for Japanese Application No. 2013-046521; 4 Pages.
Response (with Machine English Translation) to Japanese Office Action dated Feb. 27, 2014 for Japanese Application No. 2013-046521; Response filed Aug. 4, 2014; 6 Pages.
Japanese Decision to Grant (with Machine English Translation) dated Sep. 29, 2014 for Japanese Application No. 2013-046521; 5 Pages.
U.S. Non-Final Office Action dated Jan. 4, 2007 for U.S. Appl. No. 10/962,889; 9 Pages.
Response to U.S. Non-Final Office Action dated Jan. 4, 2007 for U.S. Appl. No. 10/962,889; Response filed Apr. 4, 2007; 14 Pages.
U.S. Final Office Action dated Jun. 12, 2007 for U.S. Appl. No. 10/962,889; 8 Pages.
Response to U.S. Final Office Action dated Jun. 12, 2007 for U.S. Appl. No. 10/962,889; Response filed Aug. 3, 2007; 8 Pages.
U.S. Advisory Action dated Aug. 16, 2007 for U.S. Appl. No. 10/962,889; 3 Pages.
U.S. Appeal Brief filed Nov. 26, 2007 for U.S. Appl. No. 10/962,889; 12 Pages.
U.S. Non-Compliant Appeal Brief dated Mar. 3, 2008 for U.S. Appl. No. 10/962,889; 2 Pages.
Response to U.S. Non-Compliant Appeal Brief dated Mar. 3, 2008 for U.S. Appl. No. 10/962,889; Response filed Mar. 17, 2008; 12 Pages.
U.S. Examiners Answer dated Jun. 23, 2008 for U.S. Appl. No. 10/962,889; 6 Pages.
U.S. Decision on Appeal dated Nov. 3, 2009 for U.S. Appl. No. 10/962,889; 7 Pages.
U.S. $1^{st}$ Notice of Allowance dated Feb. 17, 2010 for U.S. Appl. No. 10/962,889; 5 Pages.
U.S. $2^{nd}$ Notice of Allowance dated Jun. 1, 2010 for U.S. Appl. No. 10/962,889; 14 Pages.
U.S. Notice of Allowance dated Oct. 22, 2021 for U.S. Appl. No. 16/825,368; 20 Pages.

\* cited by examiner

INTERLEAVING SUB-ARRAYS OF MAGNETORESISTANCE ELEMENTS BASED ON REFERENCE DIRECTIONS TO COMPENSATE FOR BRIDGE OFFSET

BACKGROUND

Bridges typically include four or more magnetoresistance elements. Magnetoresistance elements in a bridge may include tunnel magnetoresistance (TMR) elements. Each TMR element may include a plurality of pillars. Generally, in fabricating bridges (e.g., a Wheatstone bridge), pillars of a TMR element are grouped together on a die in a location separate from the pillars of the other TMR elements.

The output of a bridge is ideally zero when no external magnetic field is applied. However, due to manufacturing techniques of TMR elements, mismatches and artifacts may form when TMR elements are used in bridges causing the bridge output to have a non-zero value called a bridge offset.

SUMMARY

In one aspect, a bridge includes a first set of sub-arrays forming a first magnetoresistance element, a second set of sub-arrays forming a second magnetoresistance element, a third set of sub-arrays forming a third magnetoresistance element, a fourth set of sub-arrays forming a fourth magnetoresistance element, a fifth set of sub-arrays forming a fifth magnetoresistance element, a sixth set of sub-arrays forming a sixth magnetoresistance element, a seventh set of sub-arrays forming a seventh magnetoresistance element, and an eighth set of sub-arrays forming an eighth magnetoresistance element. Each sub-array of the first set has a first reference direction, each sub-array of the second set has a second reference direction different from the first reference direction, each sub-array of the third set has a third reference direction, each sub-array of the fourth set has a fourth reference direction different from the third reference direction, each sub-array of the fifth set has a fifth reference direction, each sub-array of the sixth set has a sixth reference direction different from the fifth reference direction, each sub-array of the seventh set has a seventh reference direction, and each sub-array of the eighth set has an eighth reference direction different from the seventh reference direction. The first, the second, the third, the fourth, the fifth, the sixth, the seventh and the eighth sets of sub-arrays are arranged in a matrix on a die.

In a further aspect, a magnetic field sensor includes a bridge. The bridge includes a first set of sub-arrays forming a first magnetoresistance element, a second set of sub-arrays forming a second magnetoresistance element, a third set of sub-arrays forming a third magnetoresistance element, a fourth set of sub-arrays forming a fourth magnetoresistance element, a fifth set of sub-arrays forming a fifth magnetoresistance element, a sixth set of sub-arrays forming a sixth magnetoresistance element, a seventh set of sub-arrays forming a seventh magnetoresistance element, and an eighth set of sub-arrays forming an eighth magnetoresistance element. Each sub-array of the first set has a first reference direction, each sub-array of the second set has a second reference direction different from the first reference direction, each sub-array of the third set has a third reference direction, each sub-array of the fourth set has a fourth reference direction different from the third reference direction, each sub-array of the fifth set has a fifth reference direction, each sub-array of the sixth set has a sixth reference direction different from the fifth reference direction, each sub-array of the seventh set has a seventh reference direction, and each sub-array of the eighth set has an eighth reference direction different from the seventh reference direction. The first, the second, the third, the fourth, the fifth, the sixth, the seventh and the eighth sets of sub-arrays are arranged in a matrix on a die.

In a still further aspect, a bridge includes at least eight sets of sub-arrays. Each one of the at least eight sets of sub-arrays forms a corresponding one magnetoresistance element. Each one of the at least eight sets of sub-arrays has a reference direction. The at least eight sets of sub-arrays are arranged in a matrix on a die. A reference direction of each one of the at least eight sets of sub-arrays is different from a reference direction of at least one other of the at least eight sets of sub-arrays.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAIL DESCRIPTION

Described herein are techniques to form magnetoresistance elements using different layouts on a die (i.e., integrated circuit) that co-locate sub-arrays (sometimes called pillars) of different magnetoresistance elements together. In one example, the magnetoresistance elements are tunnel magnetoresistance (TMR) elements. In one example, the sub-arrays of one TMR element are interleaved with sub-arrays from another TMR element based on the reference directions. As used herein a reference direction is a direction that a magnetoresistance elements including sub-arrays are most sensitive to changes in an external magnetic field. The techniques described herein may reduce mismatches and artifacts that may develop when TMR elements are used in bridges thereby compensating for bridge offsets.

Figure 1:
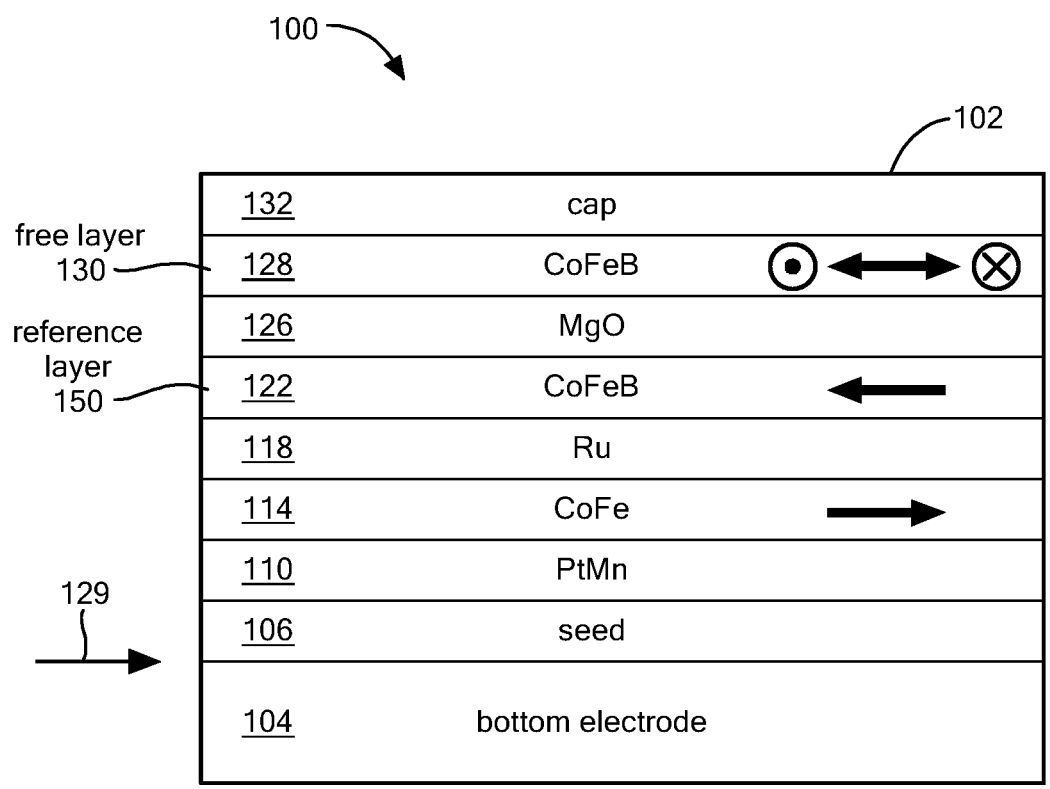
FIG. 1 is a diagram of an example of a pillar of a tunnel magnetoresistance (TMR) element.

Referring to FIG. 1, an example of a TMR element is a TMR element 100. The TMR element may include a stack 102 of layers 106, 110, 114, 118, 122, 126, 128, 132 indicative of one pillar of a multi-pillar TMR element. Generally, the layer 106 is a seed layer (e.g., a copper nickel (CuN) layer) with the layer 110 located on the seed layer 106. The layer 110 includes platinum manganese (PtMn) or iridium manganese (IrMn), for example. The layer 114 is located on the layer 110 and the layer 118 is located on the layer 114. In one example, the layer 114 includes cobalt iron (CoFe) and the layer 118 is a spacer layer and includes ruthenium (Ru). On the layer 118, a magnesium oxide (MgO) layer 126 is sandwiched between two cobalt iron boron (CoFeB) layers 122, 128. A cap layer 132 (e.g., tantalum (Ta)) is located on the CoFeB layer 128. The layer 114 is a single layer pinned layer that is magnetically coupled to the layer 110. The physical mechanism that is coupling layers 110 and 114 together is sometimes called an exchange bias.

A free layer 130 includes the CoFeB layer 128. In some examples, the free layer 130 may include an additional layer of nickel iron (NiFe) (not shown) and a thin layer of tantalum (not shown) between the CoFeB layer 128 and the NiFe layer.

It will be understood that a driving current running through the TMR element 100 runs through the layers of the stack, running between seed and cap layers 106 and 132, i.e., perpendicular to a surface of a bottom electrode 104. The TMR element 100 can have a maximum response axis that is parallel to the surface of the bottom electrode 104 and that is in a direction 129, and also parallel to the magnetization direction of a reference layer 150 that includes the layer CoFeB 122.

The TMR element 100 has a maximum response axis (maximum response to external fields) aligned with the arrow 129, i.e., perpendicular to bias directions experienced by the free layer 130, and parallel to magnetization of the reference layer 150, notably pinned layer 122. Also, in general, it is rotations of the magnetic direction of the free layer 130 caused by external magnetic fields that result in changes of resistance of the TMR element 100, which may be due to a change in angle or a change in amplitude if an external bias is present because the sum vector of the external field and the bias is causing a change in the angle between the reference and free layers.

Figure 2:
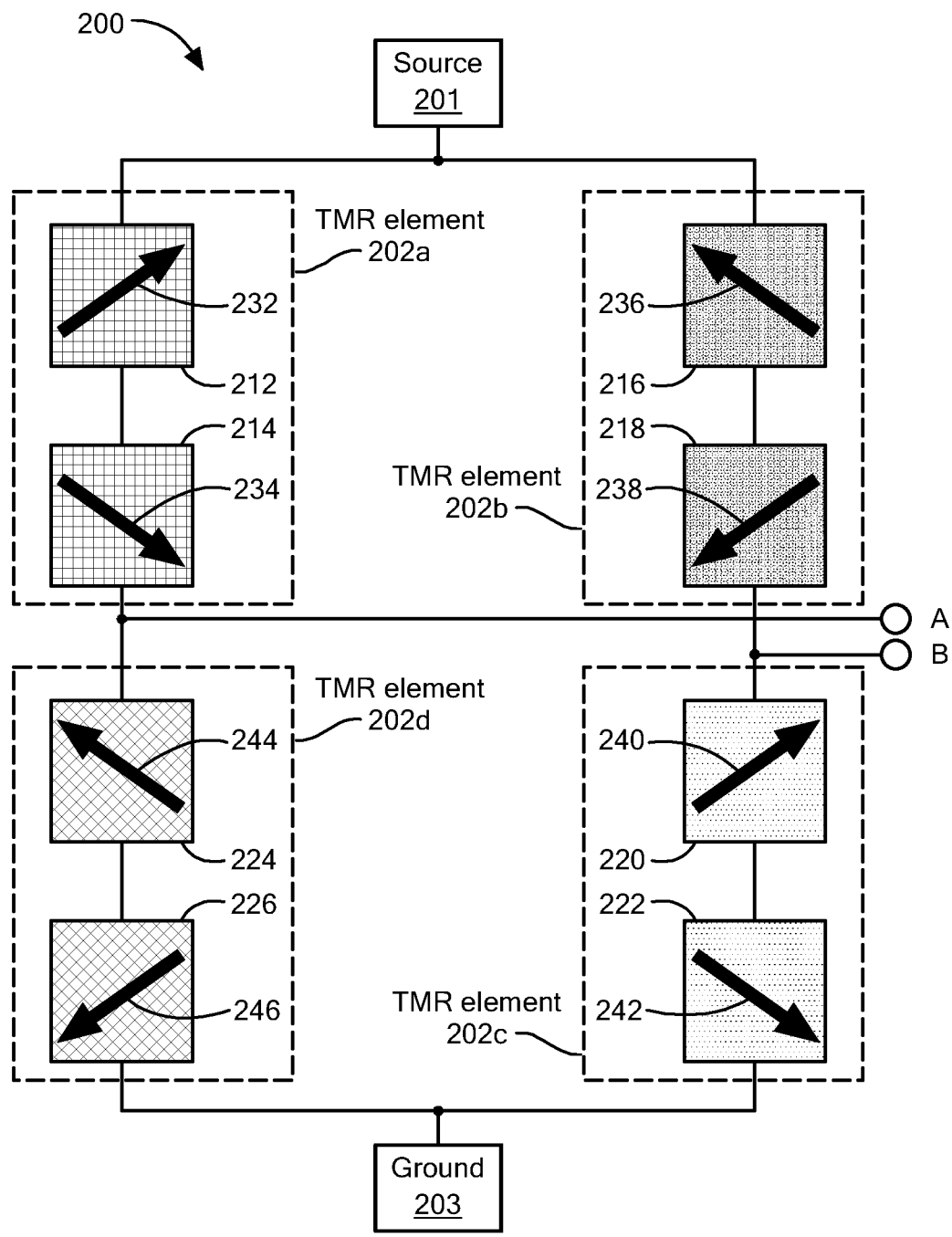
FIG. 2 is a diagram of an example of a bridge including TMR elements.
Figure 2A:
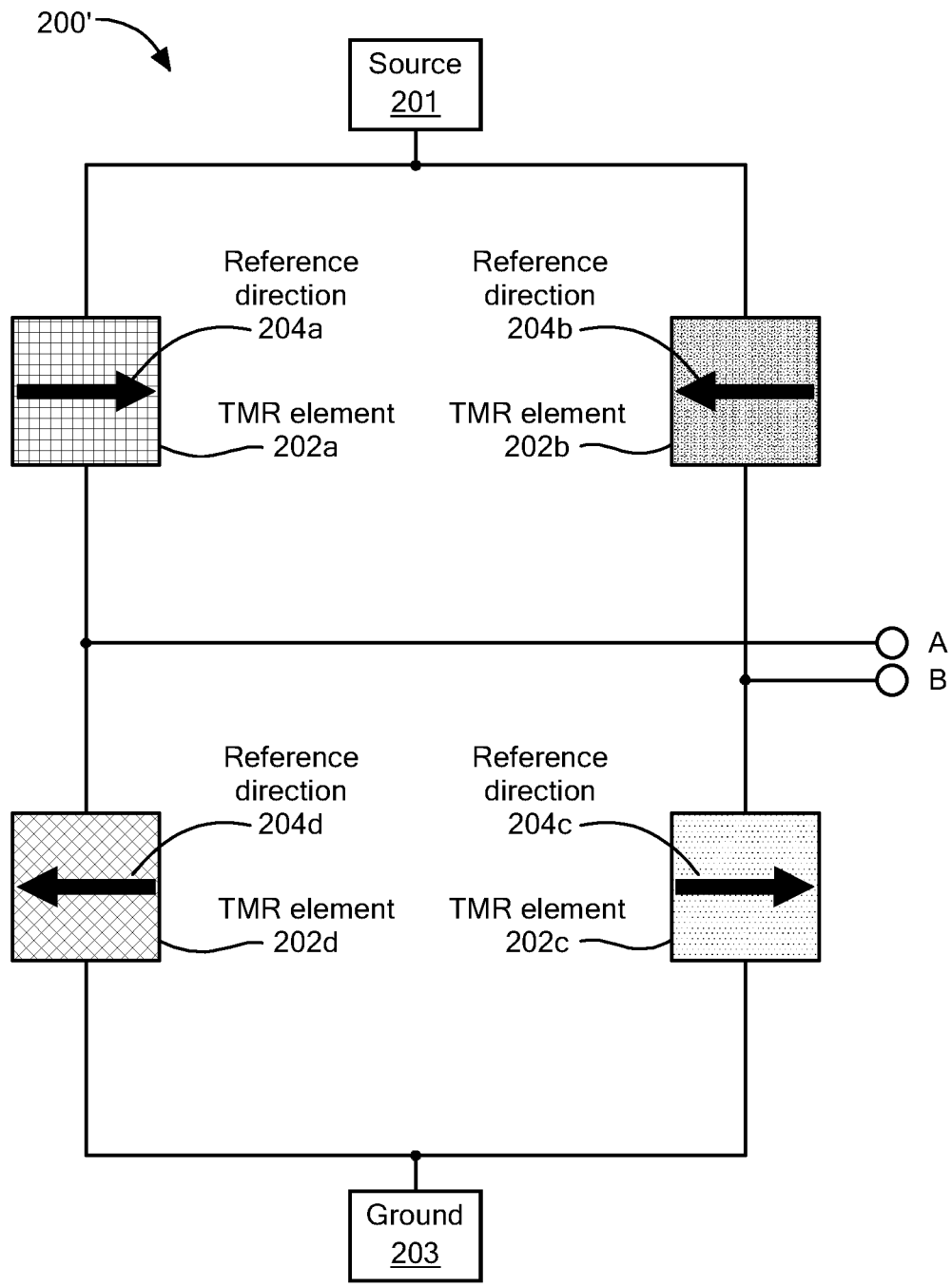
FIG. 2A is a diagram of an equivalent bridge of the bridge in FIG. 2.

Referring to FIGS. 2 and 2A, a bridge 200 includes a source 201, a ground 203 and TMR elements (e.g., a TMR element 212, a TMR element 214, a TMR element 216, a TMR element 218, a TMR element 220, a TMR element 222, a TMR element 224, a TMR element 226). In one example, a differential output is measured at nodes A and B.

Each of the TMR elements 212-226 has a reference direction. For example, TMR element 212 has a reference direction 232, TMR element 214 has a reference direction 234, TMR element 216 has a reference direction 236, TMR element 218 has a reference direction 238, TMR element 220 has a reference direction 240, TMR element 222 has a reference direction 242, TMR element 224 has a reference direction 244, and TMR element 226 has a reference direction 246.

The bridge 200 is equivalent to a bridge 200'. The TMR elements 212, 214 are equivalent to the TMR element 202a having a reference direction 204a, the TMR elements 216, 218 are equivalent to the TMR element 202b having a reference direction 204b, the TMR elements 220, 222 are equivalent to the TMR element 202c having a reference direction 204c, and the TMR elements 224, 226 are equivalent to the TMR element 202d having a reference direction 204d. A combined reference direction of the reference directions 232, 234 is equal to the reference direction 204a, a combined reference direction of the reference directions 236, 238 is equal to the reference direction 204b, a combined reference direction of the reference directions 240, 242 is equal to the reference direction 204c, and a combined reference direction of the reference directions 244, 246 is equal to the reference direction 204d.

In one example, the bridge 200 is a magnetic gradiometer. However, other bridges such as a gradient compensation bridge or magnetometer may be used with the techniques described herein. A gradient compensation bridge may be a thermal gradient compensation bridge, a resistance gradient compensation bridge and so forth.

In one example, the source 201 is a current source. The voltage difference is measured between node A and node B. In another example, the source 201 is a voltage source. The current difference is measured between node A and node B. In a further example, the source 201 is a voltage bias and the voltage is measured at the nodes A and B.

Figure 2B:
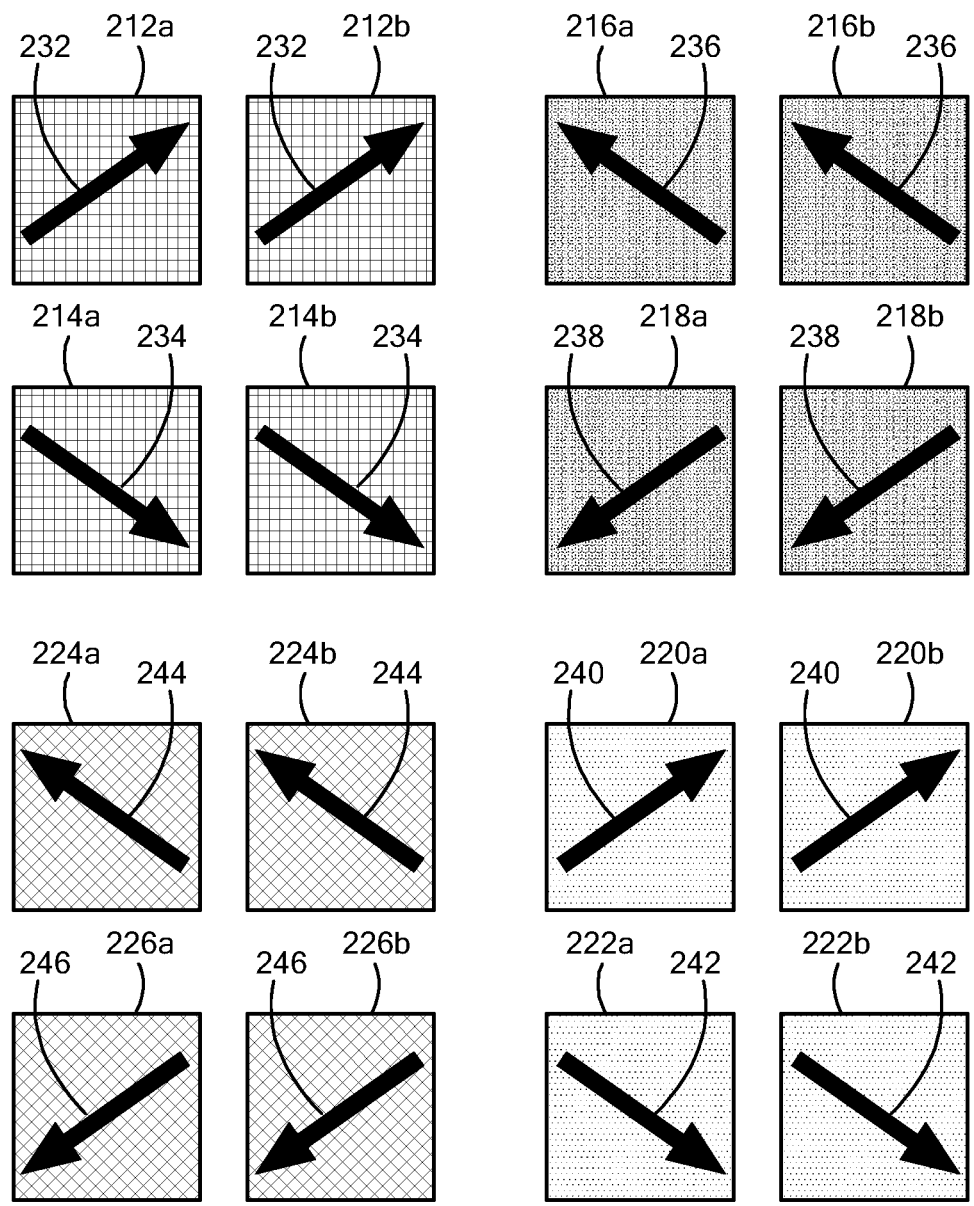
FIG. 2B is a diagram depicting TMR elements of FIG. 2 in sub-arrays.

Referring to FIG. 2B, each of the TMR elements 212-226 may be formed from two or more sub-arrays. In one particular example, the TMR element 212 may be formed from sub-arrays 212a, 212b; the TMR element 214 may be formed from sub-arrays 214a, 214b; the TMR element 216 may be formed from sub-arrays 216a, 216b; the TMR element 218 may be formed from sub-arrays 218a, 218b; the TMR element 220 may be formed from sub-arrays 220a, 220b; the TMR element 222 may be formed from sub-arrays 222a, 222b; the TMR element 224 may be formed from sub-arrays 224a, 224b; and the TMR element 226 may be formed from sub-arrays 226a, 226b.

In one example, one or more of the sub-arrays 212a-226b may be connected in series. In another example, one or more of the sub-arrays 212a-226b may be connected in parallel. In a further example, some of the sub-arrays 212a-226b may be connected in parallel and other sub-arrays may be connected in series.

Figure 2C:
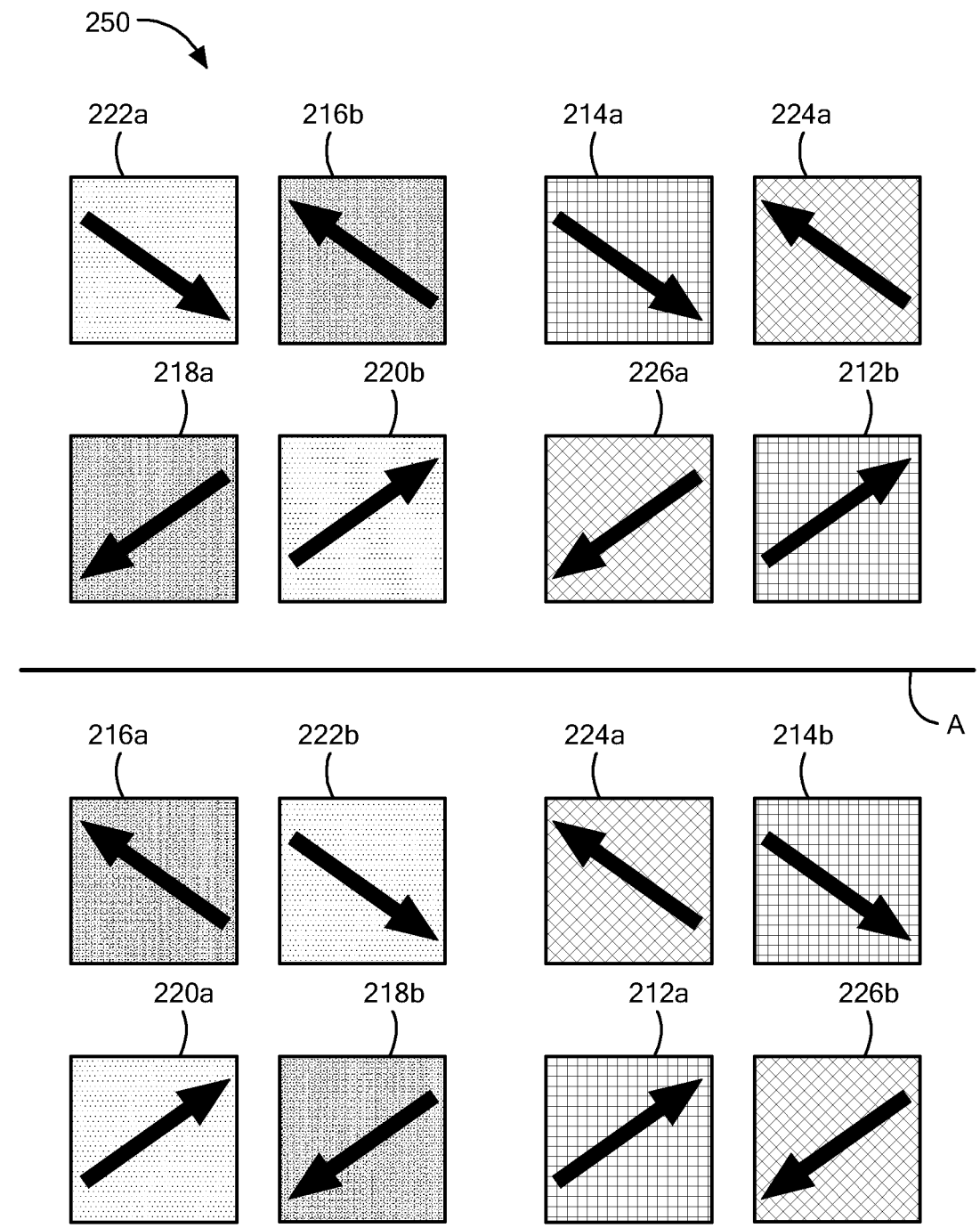
FIG. 2C is a diagram of an example of a layout of sub-arrays of FIG. 2B on a die.

Referring to FIG. 2C, the sub-arrays are placed on a die in a layout (e.g., a matrix). In one example, the sub-arrays 212a-226b are placed in a layout 250. In one example, the sub-arrays above a line are mirrored below the line A.

In one example, each row of the layout 250 includes a different sub-array from the other sub-arrays in the row. In another example, each column of the layout 250 includes a different sub-array from the other sub-arrays in the column.

In a further example, each row of the layout 250 includes a sub-array from a different TMR element. For example, a first row of layout 250 includes a TMR sub-array 222a from the TMR element 222, a TMR sub-array 216b from the TMR element 216, a TMR sub-array 214a from the TMR element 214, and a TMR sub-array 224a from the TMR element 224.

Figure 2D:
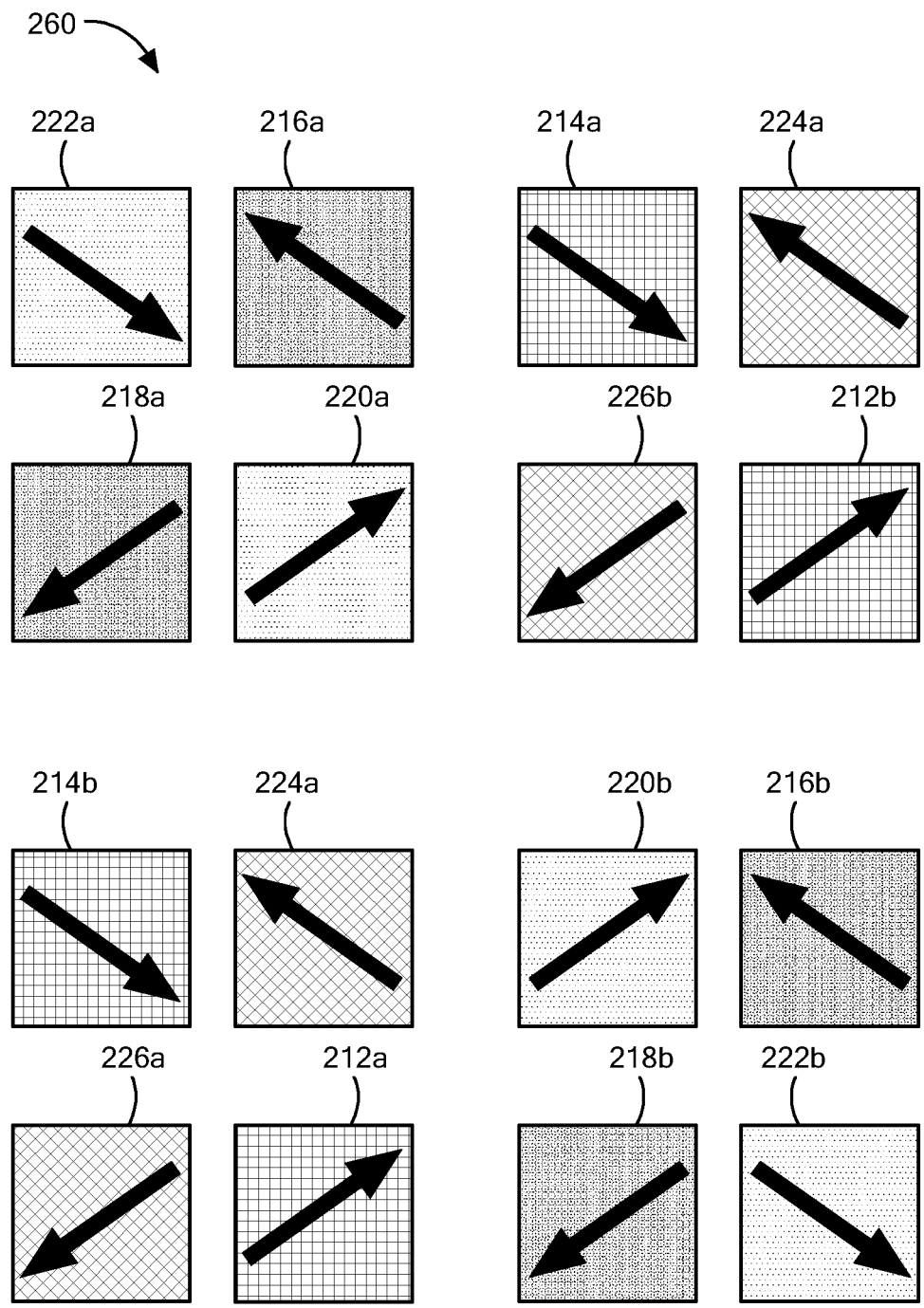
FIG. 2D is diagram of another example of a layout of TMR elements in sub-arrays of FIG. 2B on a die.

Referring to FIG. 2D, in other examples, the sub-arrays 212a-226b are placed in a layout 260. The layout 260 is a chessboard arrangement.

Each row of the layout 260 includes a sub-array from a different TMR element. For example, a first row of layout 260 includes a TMR sub-array 222a from the TMR element 222, a TMR sub-array 216a from the TMR element 216, a TMR sub-array 214a from the TMR element 214, and a TMR sub-array 224a from the TMR element 224.

Each column of the layout 260 includes a sub-array from a different TMR element. For example, a first column of layout 260 includes a TMR sub-array 222a from the TMR element 222, a TMR sub-array 218a from the TMR element 218, a TMR sub-array 214b from the TMR element 214, and a TMR sub-array 226a from the TMR element 226.

In other layouts, each column may include sub-array corresponding to a single TMR element. For example, a first column of a layout may include TMR sub-arrays 212a, 212b, 214a, 214b; a second column of the layout may include TMR sub-arrays 216a, 216b, 218a, 218b; a third column of the layout may TMR sub-arrays 220a, 220b, 222a, 222b; and a fourth column of the layout may include TMR sub-arrays 224a, 224b, 226a, 226b.

Figure 2E:
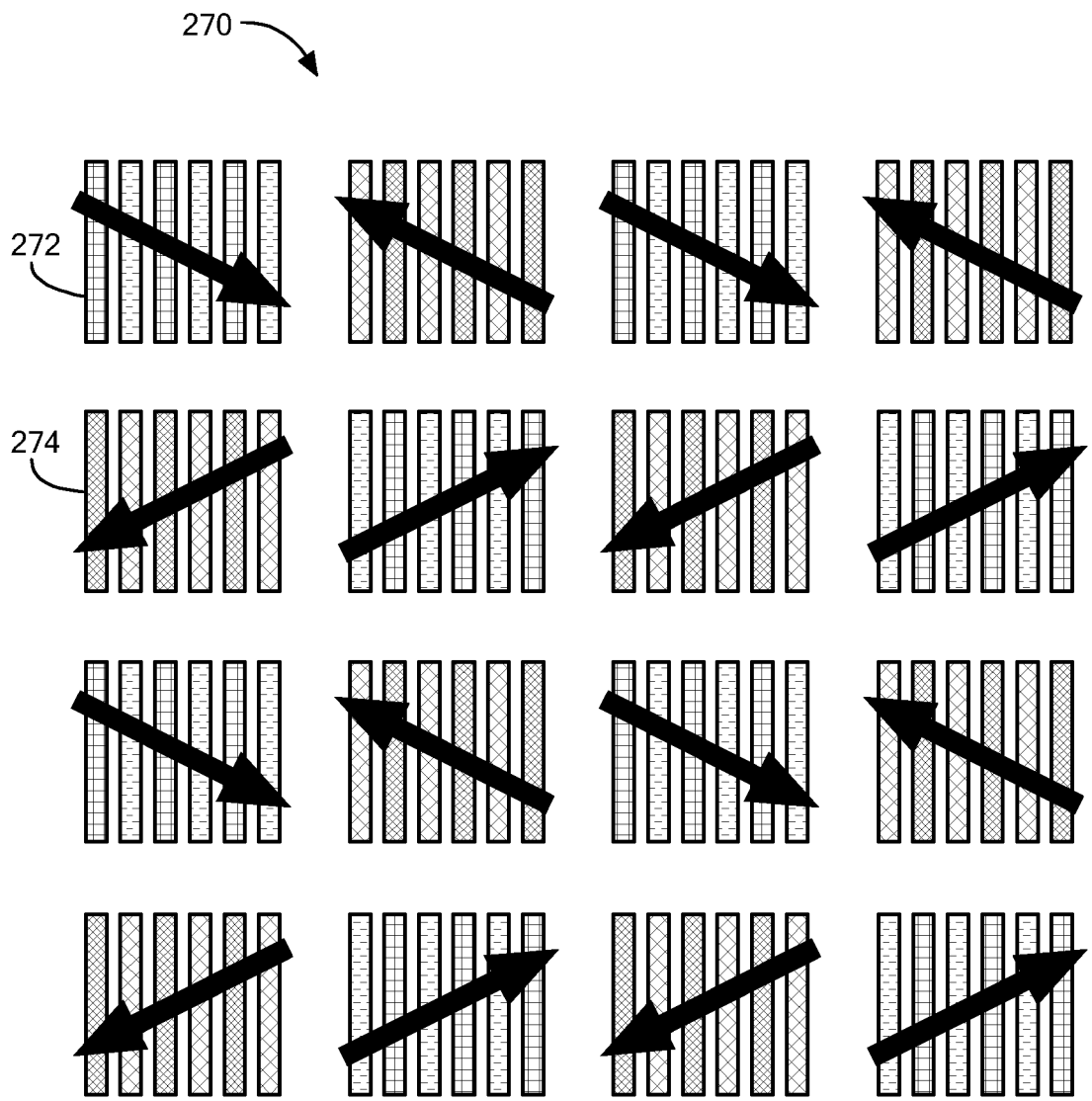
FIG. 2E is a diagram of a further example of a layout of TMR elements in subarray of FIG. 2B on a die.

Referring to FIG. 2E, in still further examples, interleaving may occur in the matrix with sub-arrays with different TMR elements but having the same reference directions. For example, a matrix 270 includes matrix elements with sub-arrays from different TMR elements but having the same reference directions. In one example, the matrix element 272 includes sub-arrays from TMR elements 212, 214, 220, 222 having the same reference direction, and the matrix element 274 includes sub-arrays from TMR elements 216, 218, 224, 226 having the same reference direction.

Other matrices may be used such as those described in U.S. Pat. No. 10,050,193, issued Aug. 14, 2018, which is assigned to the same entity as this patent application and is incorporated herein in its entirety.

Figure 3:
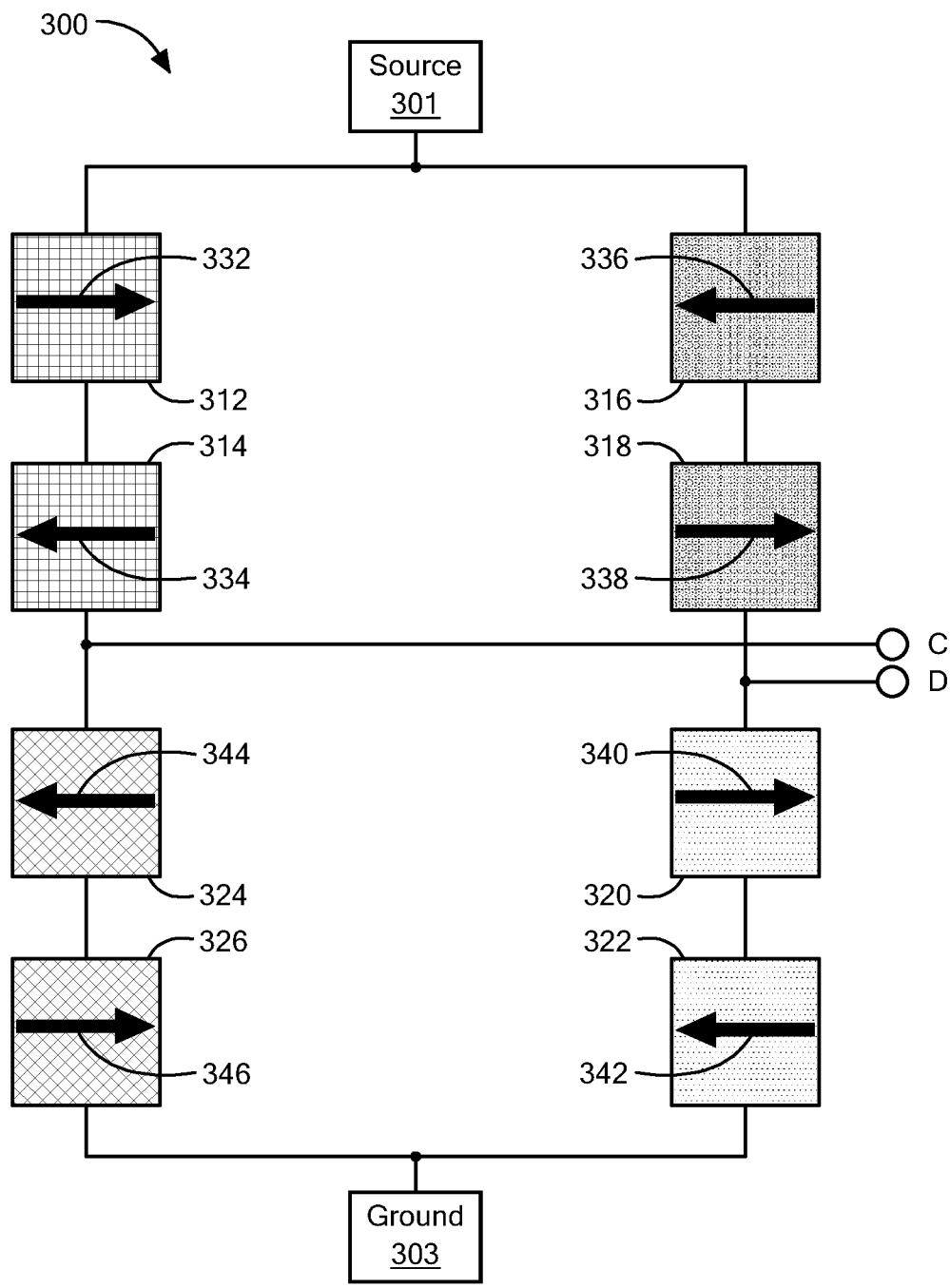
FIG. 3 is a diagram of another example of a bridge including TMR elements.

Referring to FIG. 3, a bridge 300 includes a source 301, a ground 303 and TMR elements (e.g., a TMR element 312, a TMR element 314, a TMR element 316, a TMR element 318, a TMR element 320, a TMR element 322, a TMR element 324, a TMR element 326). In one example, a differential output is measured at nodes C and D.

Each of the TMR elements 312-326 has a reference direction. For example, TMR element 312 has a reference direction 332, TMR element 314 has a reference direction 334, TMR element 316 has a reference direction 336, TMR element 318 has a reference direction 338, TMR element 320 has a reference direction 340, TMR element 322 has a reference direction 342, TMR element 324 has a reference direction 344, and TMR element 326 has a reference direction 346.

In one example, the bridge 300 is a gradient compensation bridge. A gradient compensation bridge may be a thermal gradient compensation bridge, a resistance gradient compensation bridge and so forth. However, other bridges such as a magnetic gradiometer or magnetometer may be used with the techniques described herein.

In one example, the source 301 is a current source. The voltage difference is measured between node C and node D. In another example, the source 301 is a voltage source. The current difference is measured between node C and node D.

Figure 3A:
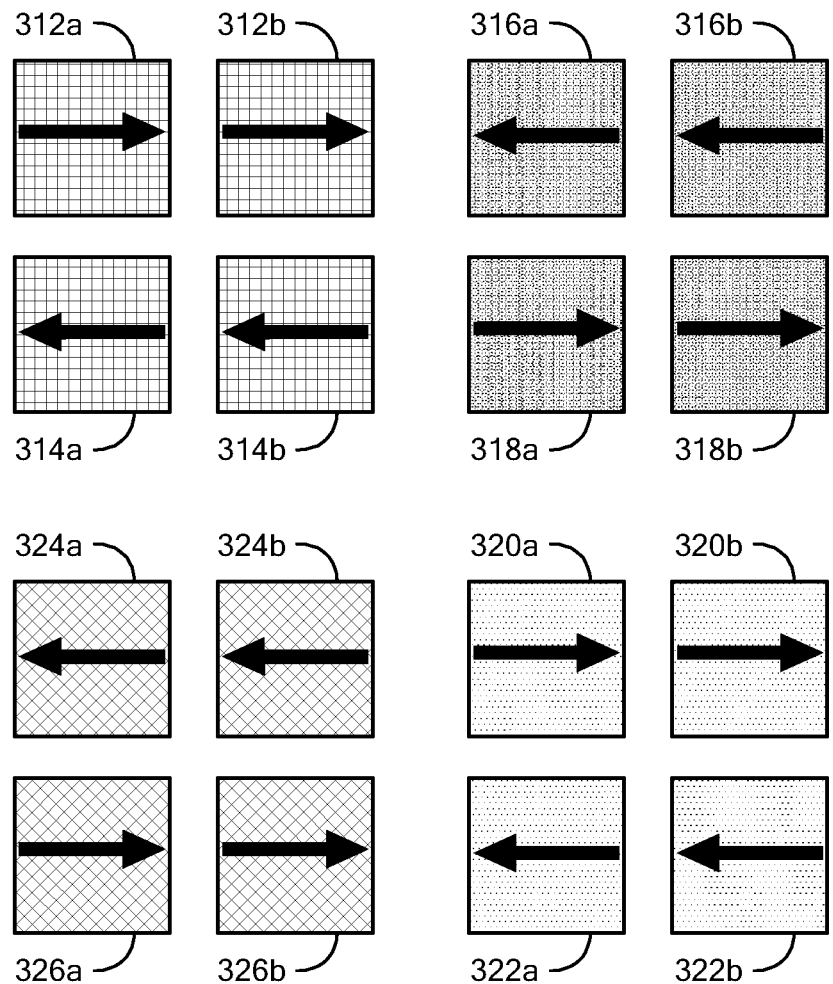
FIG. 3A is a diagram depicting TMR elements of FIG. 3 in sub-arrays.

Referring to FIG. 3A, each of the TMR elements 312-326 may be formed from two or more sub-arrays. In one particular example, the TMR element 312 may be formed from sub-arrays 312a, 312b; the TMR element 314 may be formed from sub-arrays 314a, 314b; the TMR element 316 may be formed from sub-arrays 316a, 316b; the TMR element 318 may be formed from sub-arrays 318a, 318b; the TMR element 320 may be formed from sub-arrays 320a, 320b; the TMR element 322 may be formed from sub-arrays 322a, 322b; the TMR element 324 may be formed from sub-arrays 324a, 324b; and the TMR element 326 may be formed from sub-arrays 326a, 326b.

In one example, one or more of the sub-arrays 312a-326b may be connected in series. In another example, one or more of the sub-arrays 312a-326b may be connected in parallel. In a further example, some of the sub-arrays 312a-326b may be connected in parallel and other sub-arrays may be connected in series.

Figure 3B:
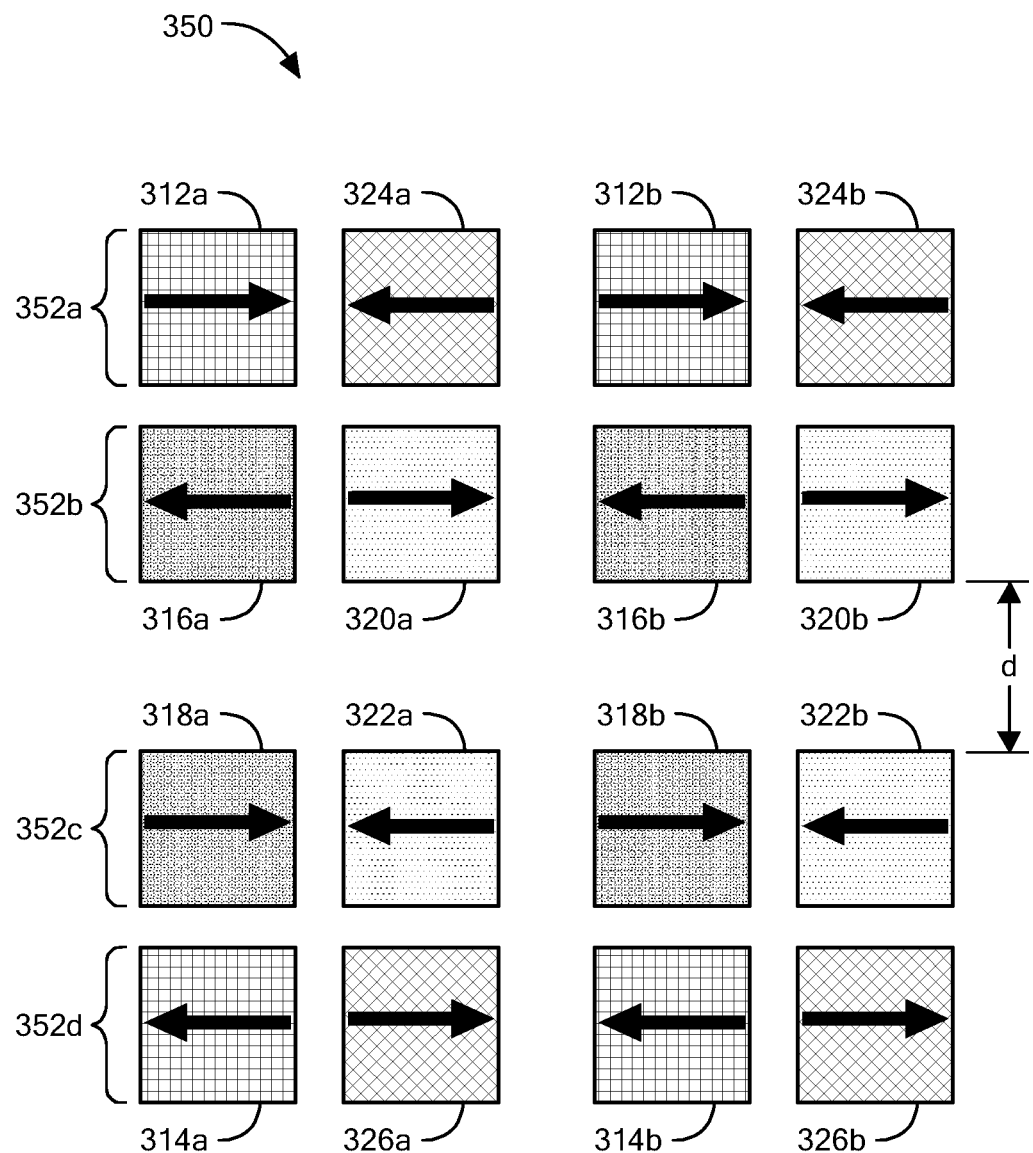
FIG. 3B is a diagram of an example of a layout of sub-arrays of FIG. 3A on a die.

Referring to FIG. 3B, in one example, the sub-arrays 312a-326b are placed in a layout 350. In one example, each column of the layout 350 includes a different sub-array from the other sub-arrays in the column.

In one particular example, top two rows 352a, 352b of the layout 350 are separated from the bottom two rows 352c, 352d of the layout 350 by a distance d. In one example, d is 500 to 2000 microns±50 microns. The top row 352a includes sub-arrays 312a, 312b of the TMR element 312 and sub-arrays 324a, 324b of the TMR element 324. The second row 352b includes sub-arrays 316a, 316b of the TMR element 316 and sub-arrays 320a, 320b of the TMR element 320. The third row 352c includes sub-arrays 318a, 318b of the TMR element 318 and sub-arrays 322a, 322b of the TMR element 322. The fourth row 352c includes sub-arrays 314a, 314b of the TMR element 314 and sub-arrays 326a, 326b of the TMR element 326.

Other layouts described herein may be used in this embodiment. Also, other matrices may be used such as those described in U.S. Pat. No. 10,050,193, issued Aug. 14, 2018, which is assigned to the same entity as this patent application and is incorporated herein in its entirety.

The techniques described herein are not limited to the specific embodiments described herein. In some embodiments, the matrices do not have to be completely filled with sub-arrays. For example, the periphery of a matrix may include dummy structures. In other embodiments, the size of the matrices is not limited to 4×4 matrices. A matrix may be any size or shape of matrix, such as for example, 8×1 or 16×16, 2×2, 16×1, and so forth depending, for example, on the number of sub-arrays, space on the IC and so forth.

The techniques described herein may be used in bridges for magnetic-field sensors. As used herein, the term "magnetic-field sensor" is used to describe a circuit that uses a magnetic-field sensing element, generally in combination with other circuits. Magnetic-field sensors are used in a variety of applications, including, but not limited to, the angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic-field sensor is used in combination with a back-biased or other magnet, and a magnetic-field sensor that senses a magnetic field density of a magnetic field.

Figure 4:
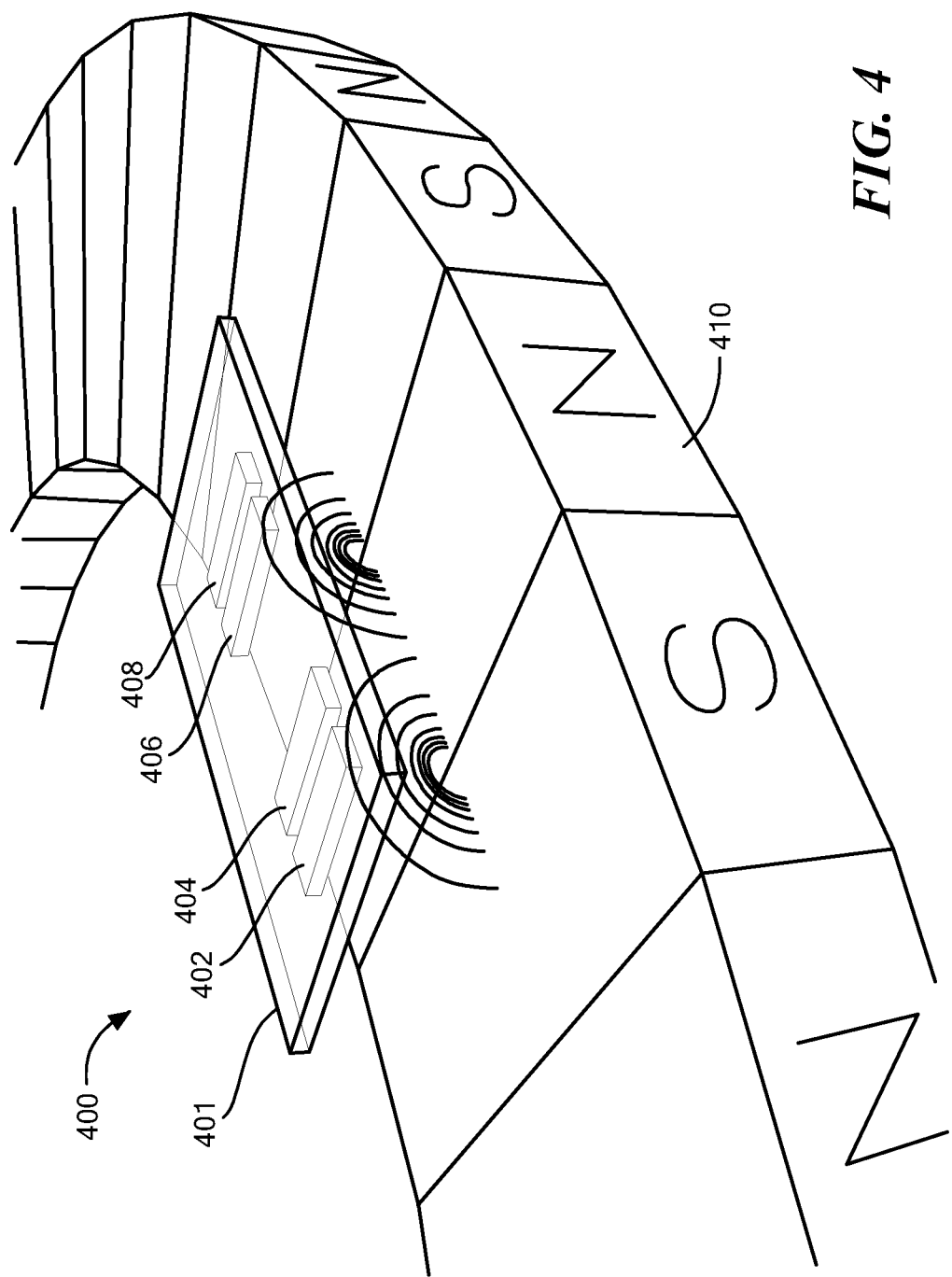
FIG. 4 is a diagram of an example of a magnetic field sensor having a bridge.

Referring to FIG. 4, an example magnetic field sensor 400 including a plurality of TMR element structures (here, four TMR element structures 402, 404, 406, 408) is shown coupled in a bridge arrangement. The TMR element structures 402, 404, 406, 408, which can be the same as or similar to TMR element structures described in connection with figures above (e.g., FIGS. 2 to 3B). It is understood that other configurations of the TMR element structures 402, 404, 406, 408 are, of course, possible. Additionally, it is understood that other electronic components (not shown), for example, amplifiers, analog-to-digital converters (ADC), and processors, i.e., an electronic circuit, can be disposed over substrate 401 and coupled to one or more of the TMR element structures 402, 404, 406, 408, for example, to process signals (i.e., magnetic field signals) produced by the TMR element structures 402, 404, 406, 408.

In the illustrated embodiment, the magnetic field sensor 400 is disposed proximate to a moving magnetic object, for example, a ring magnet 410 having alternative north and south magnetic poles. The ring magnet 410 is subject to motion (e.g., rotation) and the TMR element structures 402, 404, 406, 408 of the magnetic field sensor 400 may be oriented such that maximum response axes of the TMR element structures 402, 404, 406, 408 are aligned with a magnetic field (e.g., an applied magnetic field) generated by the ring magnet 410. In embodiments, the maximum responses axes of the TMR element structures 402, 404, 406, 408 may also be aligned with a magnetic field (e.g., a local magnetic field) generated by a magnet (not shown) disposed proximate to or within the magnetic field sensor 400. With such a back-biased magnet configuration, motion of the ring magnet 410 can result in variations of the magnetic field sensed by the TMR element structures 402, 404, 406, 408.

In embodiments, the TMR element structures 402, 404, 406, 408 are driven by a voltage source and configured to generate one or more magnetic field signals in response to motion of the ring magnet 410, e.g., in a first direction of motion and in a second direction of motion that is different than the first direction of motion. Additionally, in embodiments, one or more electronic components (e.g., ADC) (not shown) on the magnetic field sensor 400 are coupled to receive the magnetic fields signals and configured to generate an output signal indicative of position, proximity, speed and/or direction of motion of the ring magnet 410, for example. In some embodiments, the ring magnet 410 is coupled to a target object, for example, a cam shaft in an engine, and a sensed speed of motion of the ring magnet 410 is indicative of a speed of motion of the target object. The output signal (e.g., an output voltage) of the magnetic field sensor 400 generally has a magnitude related to a magnitude of the magnetic field experienced by the TMR element structures 402, 404, 406, 408.

Additionally, in embodiments in which the TMR element structures 402, 404, 406, 408 are provided as TMR element structures according to the disclosure (e.g., FIGS. 2 to 5), and the magnetic field sensor 400 includes electronic components (e.g., ADCs) coupled to receive magnetic field signals from the TMR element structures 402, 404, 406, 408 and configured to generate the output signal of the magnetic field sensor 400, operational requirements of the electronic components (e.g., so-called "front end electronics" or "signal processing electronics") may, for example, be reduced in comparison to embodiments in which the magnetic field sensor 400 includes conventional magnetoresistance elements.

While the magnetic field sensor 400 is shown and described as a motion detector to motion rotation of the ring magnet 410 in the illustrated embodiment, it is understood that other magnetic field sensors, for example, current sensors or angle sensors, may include one or more of the TMR element structures according to the disclosure.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A bridge comprising:
  a first set of sub-arrays forming a first magnetoresistance element, each sub-array of the first set having a first reference direction;
  a second set of sub-arrays forming a second magnetoresistance element, each sub-array of the second set having a second reference direction different from the first reference direction;
  a third set of sub-arrays forming a third magnetoresistance element, each sub-array of the third set having a third reference direction;
  a fourth set of sub-arrays forming a fourth magnetoresistance element, each sub-array of the fourth set having a fourth reference direction different from the third reference direction;
  a fifth set of sub-arrays forming a fifth magnetoresistance element, each sub-array of the fifth set having a fifth reference direction;
  a sixth set of sub-arrays forming a sixth magnetoresistance element, each sub-array of the sixth set having a sixth reference direction different from the fifth reference direction;
  a seventh set of sub-arrays forming a seventh magnetoresistance element, each sub-array of the seventh set having a seventh reference direction; and
  an eighth set of sub-arrays forming an eighth magnetoresistance element, each sub-array of the eighth set having an eighth reference direction different from the seventh reference direction,
  wherein the first, the second, the third, the fourth, the fifth, the sixth, the seventh and the eighth sets of sub-arrays are arranged in a matrix on a die.

2. The bridge of claim 1, wherein each sub-array in a row of the matrix is different from other sub-arrays in the row.

3. The bridge of claim 2, wherein each sub-array in a column of the matrix is different from other sub-arrays in the column.

4. The bridge of claim 1, wherein each sub-array in a column of the matrix is different from other sub-arrays in the column.

5. The bridge of claim 1, further comprising:
  a first plurality of magnetoresistance elements comprising the first and the second magnetoresistance elements;
  a second plurality of magnetoresistance elements comprising the third and the fourth magnetoresistance elements;
  a third plurality of magnetoresistance elements comprising the fifth and the sixth magnetoresistance elements; and
  a fourth plurality of magnetoresistance elements comprising the seventh and the eighth magnetoresistance elements,
  wherein each row of the matrix or each column of the matrix includes a sub-array from each of the first plurality, the second plurality, the third plurality and the fourth plurality of magnetoresistance elements.

6. The bridge of claim 5, wherein each row of the matrix and each column of the matrix includes a sub-array from each of the first plurality, the second plurality, the third plurality and the fourth plurality of magnetoresistance elements.

7. The bridge of claim 1, wherein the first magnetoresistance element, the second magnetoresistance element, the third magnetoresistance element, the fourth magnetoresistance element, the fifth magnetoresistance element, the sixth magnetoresistance element, the seventh magnetoresistance element and/or the eighth magnetoresistance element is a tunnel magnetoresistance (TMR) element.

8. The bridge of claim 1, wherein the matrix includes interleaving of sub-arrays from different magnetoresistance elements having the same reference direction.

9. The bridge of claim 1, wherein the sub-arrays placed in the matrix are placed in a chessboard arrangement in the matrix.

10. The bridge of claim 1, wherein the bridge is a magnetic gradiometer, a gradient compensation bridge or a magnetometer.

11. The bridge of claim 1, wherein the first, the second, the seventh and the eighth magnetoresistance elements are connected in series electrically,
wherein the first, the second, the seventh and the eighth magnetoresistance elements are connected in parallel electrically with the third, the fourth, the fifth and the sixth magnetoresistance elements.

12. A magnetic field sensor comprising:
a bridge comprising:
a first set of sub-arrays forming a first magnetoresistance element, each sub-array of the first set having a first reference direction;
a second set of sub-arrays forming a second magnetoresistance element, each sub-array of the second set having a second reference direction different from the first reference direction;
a third set of sub-arrays forming a third magnetoresistance element, each sub-array of the third set having a third reference direction;
a fourth set of sub-arrays forming a fourth magnetoresistance element, each sub-array of the fourth set having a fourth reference direction different from the third reference direction;
a fifth set of sub-arrays forming a fifth magnetoresistance element, each sub-array of the fifth set having a fifth reference direction;
a sixth set of sub-arrays forming a sixth magnetoresistance element, each sub-array of the sixth set having a sixth reference direction different from the fifth reference direction;
a seventh set of sub-arrays forming a seventh magnetoresistance element, each sub-array of the seventh set having a seventh reference direction; and
an eighth set of sub-arrays forming an eighth magnetoresistance element, each sub-array of the eighth set having an eighth reference direction different from the seventh reference direction,
wherein the first, the second, the third, the fourth, the fifth, the sixth, the seventh and the eighth sets of sub-arrays are arranged in a matrix on a die.

13. The magnetic field sensor of claim 12, wherein each sub-array in a row of the matrix is different from other sub-arrays in the row.

14. The magnetic field sensor of claim 13, wherein each sub-array in a column of the matrix is different from other sub-arrays in the column.

15. The magnetic field sensor of claim 12, wherein each sub-array in a column of the matrix is different from other sub-arrays in the column.

16. The magnetic field sensor of claim 12, further comprising:
a first plurality of magnetoresistance elements comprising the first and the second magnetoresistance elements;
a second plurality of magnetoresistance elements comprising the third and the fourth magnetoresistance elements;
a third plurality of magnetoresistance elements comprising the fifth and the sixth magnetoresistance elements; and
a fourth plurality of magnetoresistance elements comprising the seventh and the eighth magnetoresistance elements,
wherein each row of the matrix or each column of the matrix includes a sub-array from each of the first plurality, the second plurality, the third plurality and the fourth plurality of magnetoresistance elements.

17. The magnetic field sensor of claim 16, wherein each row of the matrix and each column of the matrix includes a sub-array from each of the first plurality, the second plurality, the third plurality and the fourth plurality of magnetoresistance elements.

18. The magnetic field sensor of claim 12, wherein the first magnetoresistance element, the second magnetoresistance element, the third magnetoresistance element, the fourth magnetoresistance element, the fifth magnetoresistance element, the sixth magnetoresistance element, the seventh magnetoresistance element and/or the eighth magnetoresistance element is a tunnel magnetoresistance (TMR) element.

19. The magnetic field sensor of claim 12, wherein the matrix includes interleaving of sub-arrays from different magnetoresistance elements having the same reference direction.

20. The magnetic field sensor of claim 12, wherein the sub-arrays placed in the matrix are placed in a chessboard arrangement in the matrix.

21. The magnetic field sensor of claim 12, wherein the bridge is a magnetic gradiometer, a gradient compensation bridge or a magnetometer.

22. The magnetic field sensor of claim 12, wherein the first, the second, the seventh and the eighth magnetoresistance elements are connected in series electrically,
wherein the first, the second, the seventh and the eighth magnetoresistance elements are connected in parallel electrically with the third, the fourth, the fifth and the sixth magnetoresistance elements.

23. A bridge, comprising:
at least eight sets of sub-arrays, each of the at least eight sets of sub-arrays forming a corresponding one magnetoresistance element, each of the at least eight sets of sub-arrays having a reference direction,
wherein the at least eight sets of sub-arrays are arranged in a matrix on a die, and
wherein a reference direction of each one of the at least eight sets of sub-arrays is different from a reference direction of at least one other of the at least eight sets of sub-arrays.

24. The bridge of claim 23, wherein the matrix includes interleaving of sub-arrays from different magnetoresistance elements having the same reference direction.

25. The bridge of claim 23, wherein each sub-array in a row of the matrix is different from other sub-arrays in the row.

26. The bridge of claim 23, wherein each sub-array in a column of the matrix is different from other sub-arrays in the column.

27. The bridge of claim 23, wherein the corresponding one magnetoresistance element is a tunnel magnetoresistance (TMR) element.

* * * * *